US007941917B2

(12) United States Patent
Shadel et al.

(10) Patent No.: US 7,941,917 B2

(45) Date of Patent: May 17, 2011

(54) METHODS OF ASSEMBLING CABLE SEALS

(75) Inventors: Bryan James Shadel, Gardnerville, NV (US); Christopher Charles McMillen, Carson City, NV (US)

(73) Assignee: General Electric Company, Schenectady, NY (US)

(*) Notice: Subject to any disclaimer, the term of this patent is extended or adjusted under 35 U.S.C. 154(b) by 1004 days.

(21) Appl. No.: 11/749,481

(22) Filed: May 16, 2007

(65) Prior Publication Data

US 2007/0214638 A1 Sep. 20, 2007

Related U.S. Application Data

(62) Division of application No. 11/297,671, filed on Dec. 8, 2005, now Pat. No. 7,232,955.

(51) Int. Cl.
*H01R 43/00* (2006.01)
*H05K 13/00* (2006.01)

(52) U.S. Cl. ............ 29/854; 29/859; 174/74 A; 439/523

(58) Field of Classification Search .................... 29/825, 29/854, 858, 859, 861; 174/102 R, 106 R, 174/120 SR, 73.1, 74 A, 74 R, 77 R; 428/375, 379, 383; 439/521, 936, 523
See application file for complete search history.

(56) References Cited

U.S. PATENT DOCUMENTS

| | | | | |
|---|---|---|---|---|
| 4,801,501 | A * | 1/1989 | Harlow | 428/383 |
| 5,072,073 | A | 12/1991 | Becker et al. | |
| 5,226,837 | A * | 7/1993 | Cinibulk et al. | 439/936 |
| 5,477,011 | A * | 12/1995 | Singles et al. | 174/102 R |
| 5,902,150 | A | 5/1999 | Sigl et al. | |
| 6,193,548 | B1 | 2/2001 | Sigl et al. | |
| 6,326,550 | B1 | 12/2001 | Dyer et al. | |
| 6,386,915 | B1 | 5/2002 | Nelson | |
| 6,434,317 | B1 | 8/2002 | Dyer et al. | |
| 6,893,290 | B2 | 5/2005 | Buenz et al. | |
| 7,014,502 | B2 | 3/2006 | Rasmussen | |
| 7,044,785 | B2 | 5/2006 | Harwath et al. | |

* cited by examiner

*Primary Examiner* — Donghai D. Nguyen

(74) *Attorney, Agent, or Firm* — Armstrong Teasdale LLP

(57) ABSTRACT

A method of sealing a cable penetration includes assembling a cable seal and inserting the cable seal into a cable penetration. Assembling the cable seal includes adhering at least a portion of a heat-shrinkable tubing to at least a portion of a cable outer jacket, and positioning a secondary elastic seal over the heat-shrinkable tubing. An example of a secondary elastic seal could be O-rings. A cap or other means provides the outer sealing surface.

14 Claims, 2 Drawing Sheets

METHODS OF ASSEMBLING CABLE SEALS

CROSS-REFERENCE TO RELATED APPLICATIONS

This application is a divisional of U.S. patent application Ser. No. 11/297,671, filed Dec. 8, 2005, now issued as U.S. Pat. No. 7,232,955, which is hereby incorporated by reference and is assigned to assignee of the present invention.

BACKGROUND OF THE INVENTION

This invention relates generally to methods and apparatus for assembling cable seals.

Many known industrial facilities have a variety of cable systems used to conduct electrical and electronic signals between field apparatus and non-field apparatus. Some examples of field apparatus are pressure data transmitters and valve position drive motors. Some examples of non-field apparatus include power sources and control system cabinets located in areas such as control rooms and offices. Some examples of cable uses are to transmit data to and from a variety of field apparatus and non-field apparatus, transmit electronic directives to field apparatus from non-field apparatus and to provide electrical power to apparatus regardless of location.

Many known cable systems include data and power cables that are typically routed through open passages of apparatus, the open passages often referred to as cable penetrations. The cable penetrations typically have seals to maintain the integrity of the cable jackets and to mitigate the potential for vapor ingression into the associated instrumentation/electronics region of the apparatus. The aforementioned seals may also be used in circumstances where separating differing environmental conditions between an electronic device and the cable penetration is not as important as simply providing for a cable support mechanism for facilitating cable routing, for example, cable tray ingress and egress, building wall penetrations and cable vault risers.

Many facilities have operating environments that include humidity levels that may exceed 50% relative humidity and temperature levels that may exceed 66° Celsius (C.) (150° Fahrenheit (F.)) for extended periods of time. Some facilities may also have apparatus positioned such that a potential for exposure to steam or other vapors may be present. In the aforementioned environmental circumstances, the outer jackets of the cables may experience cold flow, i.e., a time dependent strain (or deformation) of the cable jacket resulting from stress, and allow a subsequent vapor ingression into the associated instrumentation/electronics region of the apparatus.

BRIEF DESCRIPTION OF THE INVENTION

In one aspect, a method of sealing a cable penetration is provided. The method includes assembling a cable seal and inserting the cable seal into a cable penetration. Assembling the cable seal includes adhering at least a portion of a heat-shrinkable tubing to at least a portion of a cable outer jacket, and positioning a secondary elastic seal over the heat-shrinkable tubing. An example of a secondary elastic seal could be O-rings. A cap or other means provides the outer sealing surface.

In another aspect, a cable seal is provided. The cable seal includes at least one cable having an FEP outer jacket. The seal also includes at least a portion of a predetermined length of a heat-shrinkable tubing that is inserted over at least a portion of the cable outer jacket. The seal further includes a cap having at least one sealing surface. The cap is inserted over at least a portion of the heat-shrinkable tubing. The seal also includes at least one elastic member. The member includes at least one sealing surface and is inserted over at least a portion of the heat-shrinkable tubing.

In a further aspect, a cable penetration sealing system is provided. The system includes a cable seal for a cable and at least one apparatus. The seal includes a predetermined length of a heat-shrinkable tubing, a cap, and at least one elastic member. The cable includes an FEP outer jacket. The tubing is inserted over at least a portion of the cable outer jacket. The cap includes at least one sealing surface and the cap is inserted over at least a portion of the heat-shrinkable tubing. The elastic member includes at least one sealing surface and is inserted over at least a portion of the heat-shrinkable tubing. The apparatus includes at least one cable penetration and the cable penetration is configured to receive the seal.

DETAILED DESCRIPTION OF THE INVENTION

Figure 1:
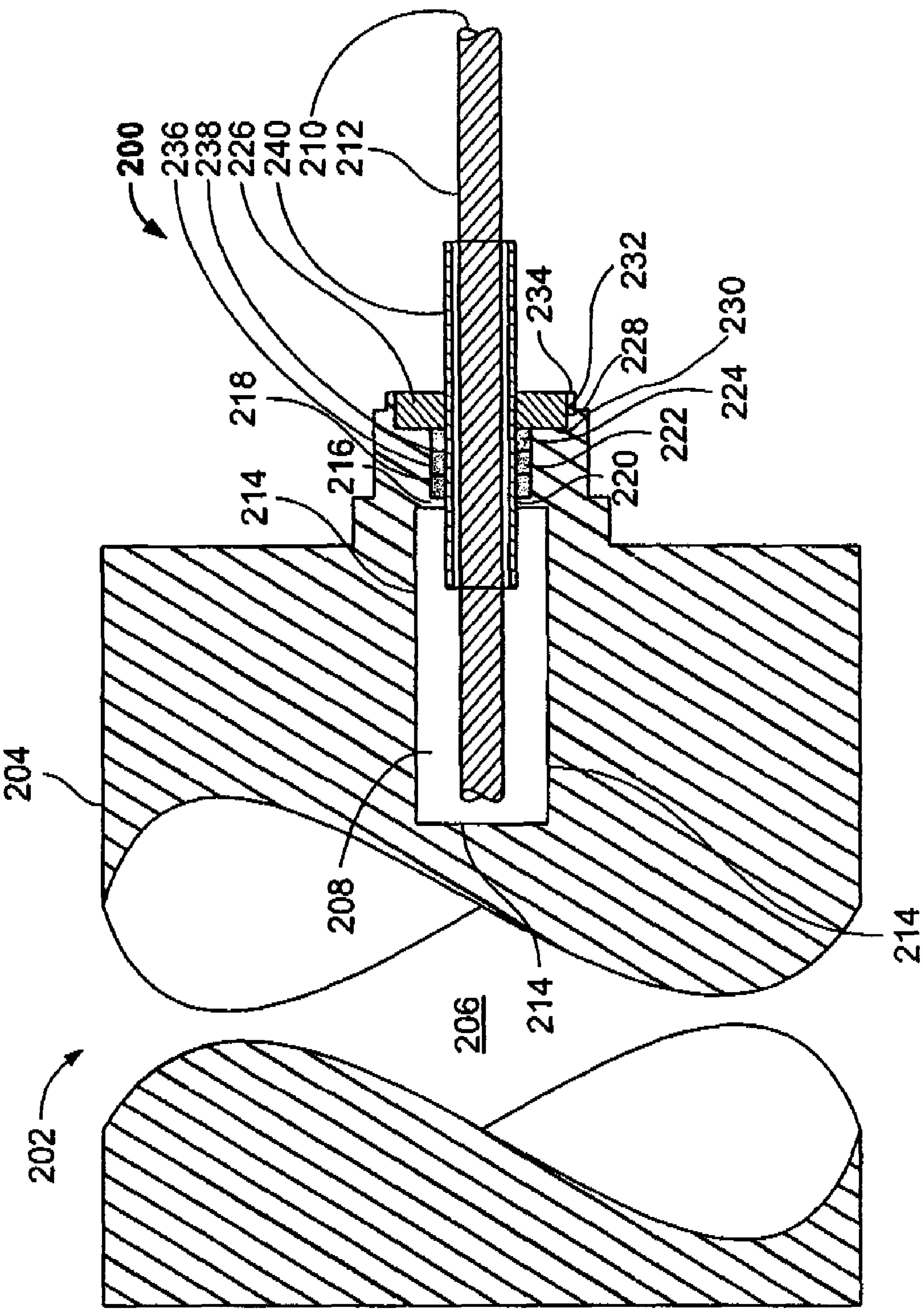
FIG. 1 is a fragmentary illustration of an exemplary cable seal.

FIG. 1 is a fragmentary illustration of an exemplary cable seal 200. Seal 200 is integral to an apparatus 202. In the exemplary embodiment, apparatus 202 is a proximity probe (sometimes referred to as an eddy current probe and/or a displacement transducer). Alternatively, apparatus 202 may be, but not be limited to, an electrical current transducer, a resistance temperature detector (RTD), or any other industrial field instrument. Also alternatively, apparatus 202 may be any object having a cable penetration, including a wall, cable tray side member, and a bracket assembly. Apparatus 202 is often used to measure bearing (not shown in FIG. 1) vibration on large machines, such as turbines, as a function of the relative movement between the bearing and the journal. As the relative position between the bearing and journal varies, an electrical signal is induced within apparatus 202. Apparatus 202 may be used with large machines including, but not limited to steam turbines, and may therefore be exposed to an environment that includes steam exiting a turbine bearing housing. The steam will normally increase the relative humidity and temperature levels within the vicinity of the bearing, and therefore, apparatus 202.

Apparatus 202 has a housing 204 that is normally cast from a material that can withstand environments that include extended high temperatures, vibration, humidity, and exposure to steam. In the exemplary embodiment, housing 204 is cast from stainless steel. Alternatively, other materials including, but not limited to, titanium alloys may be used. Housing 204 has a plurality of cavities formed during the casting process. Alternatively, at least some of these cavities may be formed using standard machining techniques subsequent to the casting process. Apparatus 202 also has an instrumentation/electronics cavity 206 that is formed by a plurality of interior walls (not shown in FIG. 1) of housing 204 to a set of predetermined dimensions to house the electronics and instrumentation (not shown in FIG. 1) used to measure the relative movement within the associated component, for example, a journal bearing, and subsequently transform an induced electronic signal into a signal that is transmitted to computer 102. Cavity 206 typically houses electrical power and electronic interconnections (not shown in FIG. 1). Therefore, cavity 206 is normally the largest cavity within housing 204 and houses the components that may be sensitive to vapor ingression.

Housing 204 also has a cable cavity 208 that is positioned and dimensioned within housing 204 to facilitate pulling a cable 210 into housing 204. Cable 210 has an outer jacket 212 that surrounds at least one electrical conductor (not shown in FIG. 1). Cavity 206 and cavity 208 may be formed integrally or as separate cavities. Substantially annular cavity 208 is formed by a substantially annular cable cavity interior wall 214 and a cable cavity housing neck 216. Neck 216 extends radially inward from the aforementioned housing inner wall and forms a substantially circular cable cavity open passage 218 and a cable cavity open passage sealing surface 220. Neck 216 and passage 218 are discussed further below.

Housing 204 further has a substantially annular open passage 222 that is formed by a substantially annular housing open passage interior wall 224 and neck 216. Furthermore, housing 204 has an annular housing opening 228 that is a widened portion of open passage 222 that is defined by an annular housing open passage vertical sealing surface 230 and an annular housing open passage horizontal sealing surface 232. Sealing surface 230 protrudes axially inward from a housing outermost surface 234 and sealing surface 232 extends substantially radially perpendicular to surface 230. Cavity 208, open passage 218, open passage 222 and housing opening 228 define a cable penetration.

Seal 200 includes a plurality of elastic media. In the exemplary embodiment the elastic media is a plurality of O-rings 236 and 238. Alternatively, elastic media such as tapes, foams, putties, or other materials that meet or exceed the predetermined characteristics of O-rings 236 and 238 may be used. Seal 200 also has a heat-shrinkable tubing 240 and a housing cap 226. Housing cap 226 is inserted over cable 210 and inserted into an annular housing opening 228. Alternative, other media and materials that meet or exceed the predetermined characteristics of cap 226 may be used, for example, tapes, foams and putties. O-rings 236, 238 and tubing 240 are discussed further below.

Figure 2:
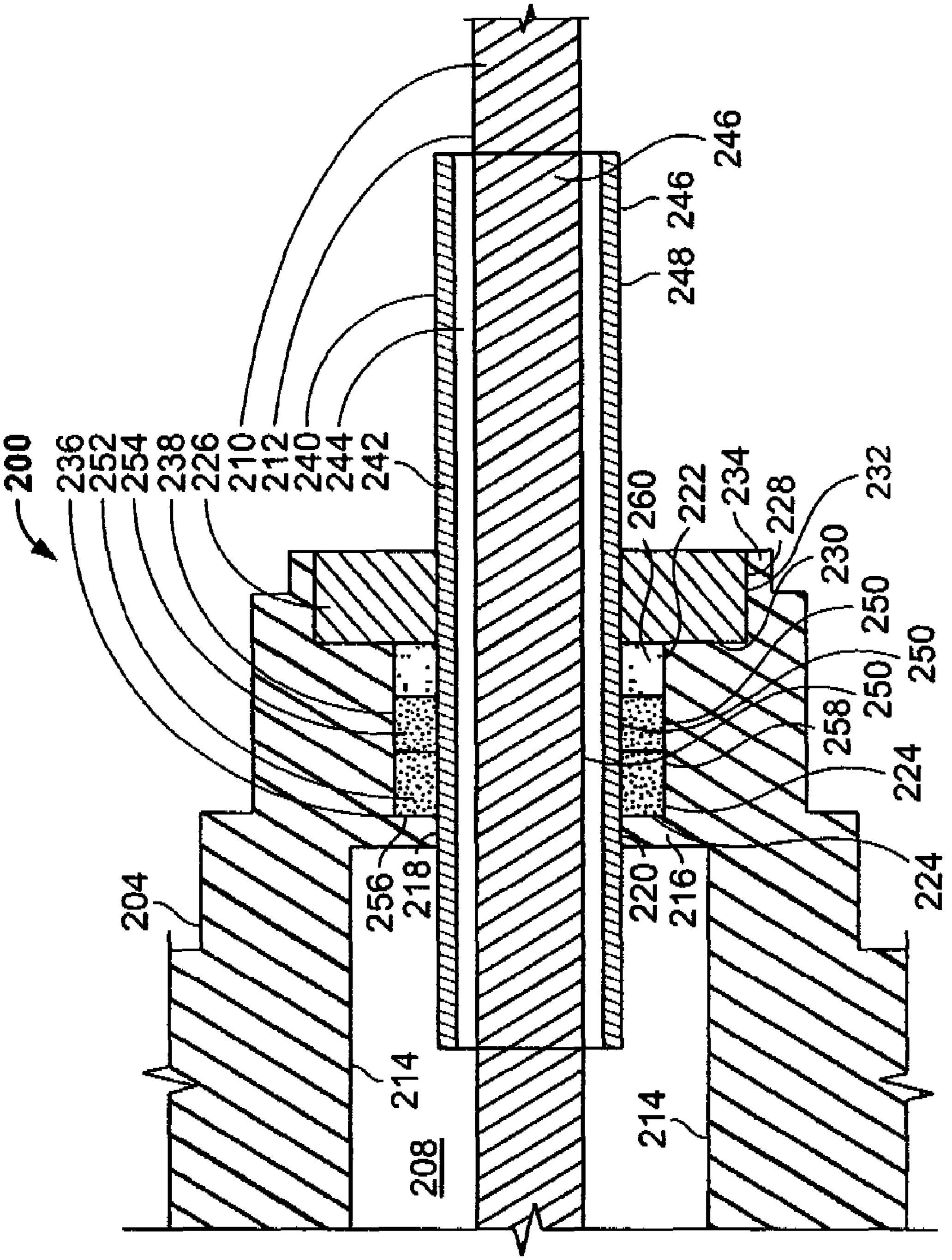
FIG. 2 is an enlarged view of the cable seal shown in FIG. 2.

FIG. 2 is an enlarged view of exemplary cable seal 200. FIG. 2 illustrates many of seal 200 components illustrated in FIG. 1 and discussed above.

In the exemplary embodiment, heat-shrinkable tubing 240 has two layers, tubing outer layer 242 and tubing inner layer 244. Outer layer 242 is formed with polytetrafluoroethylene (PTFE). As a stand-alone material, PTFE heat-shrinkable tubing generally has a shrink ratio in the 2:1 to 4:1 range, i.e., the inner diameter of a section of PTFE tubing will be reduced by approximately 50% to 75% subsequent to heat application at a temperature range of approximately 325° C. to 340° C. (617° F. to 644° F.). PTFE typically has a continuous temperature rating of approximately 250° C. (482° F.) that is usually sufficient to protect an underlying cable from a nearby steam source that may have a temperature of approximately 100° C. (212° F.) at substantially atmospheric pressures. PTFE also is substantially non-porous and normally exhibits chemical resistance properties that are sufficient for many industrial applications. Furthermore, PTFE typically exhibits a smooth outer surface that facilitates a resistance to strain as discussed further below.

Inner layer 244 is formed with fluorinated ethylene-propylene (FEP). As a stand-alone material, FEP heat-shrinkable tubing generally has a shrink ratio in the 1.3:1 to 1.6:1 range, i.e., the inner diameter of a section of PTFE tubing will be reduced by approximately 23% to 37.5% subsequent to heat application at a temperature range of approximately 190° C. to 210° C. (374° F. to 410° F.). FEP typically has a continuous temperature rating of approximately 204° C. (400° F.) that is usually sufficient to protect an underlying cable from a nearby steam source that may have a temperature of approximately 100° C. (212° F.) at substantially atmospheric pressures. FEP, similar to PTFE, also is substantially non-porous and normally exhibits chemical resistance properties that are sufficient for many industrial applications. However, FEP typically does not exhibit as smooth an outer surface as PTFE.

In the exemplary embodiment, a section of tubing 240 is cut to a predetermined length. The length may be determined from the dimensions of the length of housing open passage 222 and the predetermined lengths of heat-shrinkable tubing that extend beyond passage 222 in either of the two axial directions along cable 210. The section of tubing 240 is inserted over cable 210. Normally, it may be more convenient to slide tubing segment 240 over the end of cable 210.

Heat is applied to dual-layer tubing 240 to form a tubing-enclosed cable portion 246 (illustrated as the section of cable 210 enclosed by tubing 240 in FIG. 2). Inner FEP layer 244 melts and flows to encapsulate cable outer jacket 212. Since outer jacket 212 is also formed from FEP, jacket 212 also melts slightly and a chemical bond between tubing inner layer 244 and jacket 212 is formed. Inner FEP layer 244 does not shrink as much as outer PTFE layer 242 does, therefore, layer 242 shrinks tightly over inner FEP layer 244 to form a tight, smooth seal in conjunction with inner layer 244 on cable outer jacket 212. In the exemplary embodiment, tubing 240 has a continuous service temperature rating of approximately 200° C. (392° F.).

Alternatively, tubing 240 may have more than two layers, for example a neutral middle layer. Tubing 240 may also have one layer of a composite material that obtains substantially similar results as the exemplary embodiment.

Upon cooling of tubing-enclosed cable portion 246, housing cap 226 is inserted over cable portion 246 in a manner substantially similar to that used to insert tubing 240 over cable 210 as described above. Cap 226 has an open passage (not shown in FIG. 2) of sufficient diameter to facilitate insertion over cable portion 246 while having a clearance between an outermost surface 248 of cable portion 246 that is small enough to facilitate a mitigation of vapor ingression between cap 226 and cable portion 246 as well as provide additional structural support to cable portion 246 to mitigate strain of cable portion 246. Cap 226 is positioned over cable portion 246 at approximately the midpoint of cable portion 246 so that sufficient length of cable portion 246 extends beyond passage 222 in either of the two axial directions along cable portion outermost surface 248 to facilitate sufficient strength in the layers of cable portion 246, to mitigate strain in cable portion 246, and to establish a small clearance between the outermost surface 248 of cable portion 246 and the cable cavity open passage sealing surface 220 as discussed below.

In the exemplary embodiment, two O-rings 236 and 238 are inserted over cable portion 246 to assemble a tubing/O-ring-enclosed cable portion 250. O-rings 236 and 238 are substantially circular and annular. O-rings 236 and 238 are inserted over cable portion 246 in a manner substantially similar to that used to insert tubing 240 over cable 210 as described above. O-ring 236 and O-ring 238 expand to mitigate a clearance between a surface 252 of O-ring 236 and a surface 254 of O-ring 238 and the radially outermost surface 248 of cable portion 246 to mitigate strain of cable portion 246 and facilitate a seal that tends to mitigate vapor ingression into cavity 208 along the outermost surface 248 of cable portion 246. The smooth outermost surface 248 of tubing-enclosed cable portion 246 formed by tubing outer layer 242 facilitates the sealing action between O-rings 236 and 238 and surface 248. O-ring 238 is a redundant backup for O-ring 236.

Tubing/O-ring-enclosed cable portion 250 is inserted into housing 204 through housing open passage 222 pulled into cavity 206 (shown in FIG. 1) for subsequent electrical connection to the appropriate terminals (not shown in FIGS. 1 and 2). Cable 210 is pulled through housing 204 until O-ring 236 contacts a housing open passage vertical O-ring sealing surface 256. The aforementioned expansion of O-ring 236 also tends to mitigate clearances between surface 252 of O-ring 236 and sealing surface 256 and a housing open passage horizontal O-ring sealing surface 258. O-ring 238 expands in a similar manner, however, instead of expanding against housing open passage vertical O-ring sealing surface 256, surface 254 of O-ring 238 expands against surface 252 of O-ring 236. The expansion of O-ring 236 against surfaces 256 and 258 and the expansion of O-ring 238 against surface 258 facilitate a seal that tends to mitigate vapor ingression into cavity 208. Housing open passage void 260 permits additional expansion of O-rings 236 and 238 in the axial direction.

Inserting Tubing/O-ring-enclosed cable portion 250 in housing 204 also tends to decrease a clearance between the outermost surface 248 of cable portion 246 and the cable cavity open passage sealing surface 220 to facilitate a mitigation of vapor ingression into cavity 208 and to mitigate strain of cable portion 246.

Assembly of seal 200 is completed by inserting cap 226 into housing opening 228 such that a substantial portion of cap 226 sealing surface is in contact with a substantial portion of surfaces 230 and 232 to facilitate a mitigation of vapor ingression into cavity 208 and to mitigate strain of cable portion 246. In the exemplary embodiment, cap 226 forms a friction seal with surface 232. Alternatively, an adhesive suitable for the associated environment may be used to affix cap 226 to surfaces 230 and 232. Also alternatively, at least one set screw may be inserted into a channel formed radially through housing 204 and cap 226.

The methods and apparatus for a cable seal described herein facilitate operation of a cable penetration sealing system. More specifically, designing and installing a cable seal as described above facilitates operation of a cable penetration sealing system by mitigating an cold flow of a cable jacket. As a result, degradation of cable jacket integrity, effectiveness and reliability, extended maintenance costs and associated system outages may be reduced or eliminated.

Although the methods and apparatus described and/or illustrated herein are described and/or illustrated with respect to methods and apparatus for a cable penetration sealing system, and more specifically, an apparatus cable seal, practice of the methods described and/or illustrated herein is not limited to apparatus cable seals nor to cable penetration sealing systems generally. Rather, the methods described and/or illustrated herein are applicable to designing, installing and operating any system.

Exemplary embodiments of cable seals as associated with cable penetration sealing systems are described above in detail. The methods, apparatus and systems are not limited to the specific embodiments described herein nor to the specific cable seals designed, installed and operated, but rather, the methods of designing, installing and operating cable seals may be utilized independently and separately from other methods, apparatus and systems described herein or to designing, installing and operating components not described herein. For example, other components can also be designed, installed and operated using the methods described herein.

While the invention has been described in terms of various specific embodiments, those skilled in the art will recognize that the invention can be practiced with modification within the spirit and scope of the claims.

What is claimed is:

1. A method of sealing a cable penetration, said method comprising:

assembling a cable seal, said assembling comprising adhering at least a portion of a heat-shrinkable tubing to at least a portion of a cable outer jacket, positioning a cap over the heat-shrinkable tubing, and positioning at least one elastic member over at least a portion of the heat-shrinkable tubing, wherein the elastic member includes at least one O-ring; and inserting the cable seal into a cable penetration.

2. A method in accordance with claim 1, wherein adhering at least a portion of a heat-shrinkable tubing to at least a portion of a cable outer jacket comprises positioning the heat-shrinkable tubing over the cable outer jacket by inserting at least one open end of a predetermined length of a multi-layered heat-shrinkable tubing over at least a portion of the cable outer jacket.

3. A method in accordance with claim 1, wherein adhering at least a portion of a heat-shrinkable tubing to at least a portion of a cable outer jacket further comprises melting a heat-shrinkable tubing inner layer such that it chemically bonds with the cable outer jacket, for increasing the strength of the cable outer jacket and mitigating a potential for cable outer jacket strain and cold flow of at least a portion of the cable outer jacket.

4. A method in accordance with claim 1, wherein positioning a cap over the heat-shrinkable tubing comprises inserting a cap open passage over the heat-shrinkable tubing outer surface, for mitigating a potential for cable outer jacket strain and cold flow of at least a portion of the cable outer jacket.

5. A method in accordance with claim 1, wherein positioning at least one elastic member over at least a portion of the heat-shrinkable tubing comprises inserting at least one O-ring over a heat-shrinkable tubing outer surface, for seal between at least a portion of an O-ring substantially annular inner surface and at least a portion of the heat-shrinkable tubing outer surface by expanding the O-ring, for mitigating a potential for cable outer jacket strain and cold flow of at least a portion of the cable outer jacket.

6. A method in accordance with claim 1, wherein inserting the cable seal into a cable penetration comprises inserting at least a portion of the cable seal through at least a portion of a cable penetration and compressing at least a portion of at least one O-ring against a sealing surface within the cable penetration, for mitigating stress within at least a portion of the cable outer jacket.

7. A method in accordance with claim 1, wherein inserting the cable seal into a cable penetration further comprises inserting the cap into the open passage such that a seal between the cable penetration and an external environment is facilitated.

8. A method of sealing a cable penetration, said method comprising:

providing at least one cable that includes an fluorinated ethylene-propylene (FEP) outer jacket;

assembling a cable seal, said assembling comprising adhering at least a portion of a heat-shrinkable tubing to at least a portion of the FEP outer jacket, positioning a cap over the heat-shrinkable tubing, and positioning at least one elastic member over at least a portion of the heat-shrinkable tubing, wherein the elastic member includes at least one O-ring; and inserting the cable seal into a cable penetration.

9. A method in accordance with claim 8, wherein adhering at least a portion of a heat-shrinkable tubing to at least a portion of the FEP outer jacket comprises positioning the heat-shrinkable tubing over the FEP outer jacket by inserting at least one open end of a predetermined length of a multi-layered heat-shrinkable tubing over at least a portion of the FEP outer jacket.

10. A method in accordance with claim 8, wherein adhering at least a portion of a heat-shrinkable tubing to at least a portion of the FEP outer jacket further comprises melting a heat-shrinkable tubing inner layer such that it chemically bonds with the FEP outer jacket, for increasing the strength of the FEP outer jacket and mitigating a potential for FEP outer jacket strain and cold flow of at least a portion of the FEP outer jacket.

11. A method in accordance with claim 8, wherein positioning a cap over the heat-shrinkable tubing comprises inserting a cap open passage over the heat-shrinkable tubing outer surface, for mitigating a potential for FEP outer jacket strain and cold flow of at least a portion of the FEP outer jacket.

12. A method in accordance with claim 8, wherein positioning at least one O-ring over at least a portion of the heat-shrinkable tubing comprises inserting at least one O-ring over a heat-shrinkable tubing outer surface, for facilitating a seal between at least a portion of an O-ring substantially annular inner surface and at least a portion of the heat-shrinkable tubing outer surface by expanding the O-ring, for mitigating a potential for FEP outer jacket strain and cold flow of at least a portion of the FEP outer jacket.

13. A method in accordance with claim 8, wherein inserting the cable seal into a cable penetration comprises inserting at least a portion of the cable seal through at least a portion of the cable penetration and compressing at least a portion of at least one O-ring against a sealing surface within the cable penetration, for mitigating stress within at least a portion of the FEP outer jacket.

14. A method in accordance with claim 8, wherein inserting the cable seal into a cable penetration further comprises inserting the cap into the open passage such that a seal between the cable penetration and an external environment is facilitated.

* * * * *